United States Patent
Zhu et al.

(10) Patent No.: US 11,016,842 B2
(45) Date of Patent: May 25, 2021

(54) METHODS AND APPARATUS TO DETECT AND CORRECT ERRORS IN DESTRUCTIVE READ NON-VOLATILE MEMORY

(71) Applicant: Texas Instruments Incorporated, Dallas, TX (US)

(72) Inventors: Yuming Zhu, Plano, TX (US); Manish Goel, Plano, TX (US); Sai Zhang, Urbana, IL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 30 days.

(21) Appl. No.: 16/122,575

(22) Filed: Sep. 5, 2018

(65) Prior Publication Data

US 2019/0004897 A1 Jan. 3, 2019

Related U.S. Application Data

(62) Division of application No. 14/989,293, filed on Jan. 6, 2016, now abandoned.

(Continued)

(51) Int. Cl.
| | |
|---|---|
| G11C 29/44 | (2006.01) |
| G11C 29/52 | (2006.01) |
| G11C 29/04 | (2006.01) |
| G11C 29/42 | (2006.01) |
| G11C 29/20 | (2006.01) |
| G06F 11/10 | (2006.01) |

(Continued)

(52) U.S. Cl.
CPC ...... *G06F 11/1068* (2013.01); *G06F 11/1048* (2013.01); *G06F 11/3034* (2013.01); *G06F 11/3037* (2013.01); *G06F 11/3062* (2013.01); *G11C 16/26* (2013.01); *G11C 16/30* (2013.01); *G11C 29/04* (2013.01); *G11C 29/42* (2013.01); *G11C 29/44* (2013.01); *G11C 29/4401* (2013.01); *G11C 29/52* (2013.01); *G11C 11/22* (2013.01); *G11C 29/021* (2013.01); *G11C 2029/0407* (2013.01)

(58) Field of Classification Search
None
See application file for complete search history.

(56) References Cited

U.S. PATENT DOCUMENTS

| | | | |
|---|---|---|---|
| 3,668,632 | A | 6/1972 | Oldham, III |
| 6,243,313 | B1 | 6/2001 | Sakamoto et al. |

(Continued)

FOREIGN PATENT DOCUMENTS

WO 2013173042 11/2013

OTHER PUBLICATIONS

Sarwate et al., "High-Speed Architectures for Reed-Solomon Decoders," IEEE Transactions on Very Large Scale Integration (VLSI) Systems, vol. 9, No. 5, Oct. 2001 (15 pages).

(Continued)

*Primary Examiner* — Phung M Chung
(74) *Attorney, Agent, or Firm* — Michael A. Davis, Jr.; Charles A. Brill; Frank D. Cimino

(57) ABSTRACT

In described examples, data are stored in a destructive read non-volatile memory (DRNVM). The DRNVM includes an array of DRNVM cells organized as rows of data. The rows of data are subdivided into columns of code word symbols. Each column of code word symbols is encoded to store an error correction code symbol for each column of code word symbols.

15 Claims, 6 Drawing Sheets

Related U.S. Application Data

(60) Provisional application No. 62/258,215, filed on Nov. 20, 2015.

(51) Int. Cl.
*G06F 11/30* (2006.01)
*G11C 16/26* (2006.01)
*G11C 16/30* (2006.01)
*G11C 11/22* (2006.01)
*G11C 29/02* (2006.01)

(56) References Cited

U.S. PATENT DOCUMENTS

| | | | |
|---|---|---|---|
| 6,760,247 B2 * | 7/2004 | Komatsuzaki | G11C 11/22 365/145 |
| 7,149,950 B2 * | 12/2006 | Spencer | G06F 11/1008 714/763 |
| 7,168,026 B2 | 1/2007 | Gamey et al. | |
| 7,191,379 B2 * | 3/2007 | Adelmann | G06F 11/1008 365/201 |
| 8,400,530 B2 | 3/2013 | Ikeda et al. | |
| 9,411,678 B1 | 8/2016 | Ware et al. | |
| 9,812,185 B2 * | 11/2017 | Fisch | G11C 29/06 |
| 10,108,509 B2 * | 10/2018 | Qidwai | G11C 29/52 |
| 2002/0199152 A1 * | 12/2002 | Garney | G11C 29/44 714/765 |
| 2004/0010742 A1 | 1/2004 | Williamson et al. | |
| 2005/0055621 A1 * | 3/2005 | Adelmann | G06F 11/1008 714/758 |
| 2013/0061115 A1 | 3/2013 | Imai et al. | |

OTHER PUBLICATIONS

International Search Report for PCT/US2016/063098 dated Feb. 9, 2017.

* cited by examiner

METHODS AND APPARATUS TO DETECT AND CORRECT ERRORS IN DESTRUCTIVE READ NON-VOLATILE MEMORY

CROSS-REFERENCE TO RELATED APPLICATIONS

This application is a divisional of U.S. patent application Ser. No. 14/989,293 filed Jan. 6, 2016, which claims the benefit of U.S. Provisional Patent Application Ser. No. 62/258,215 filed Nov. 20, 2015, the entireties of both of which are incorporated herein by reference.

BACKGROUND

This relates generally to destructive read memory, and, more particularly to methods and apparatus to detect and correct errors in destructive read non-volatile memory.

In recent years, low power computing applications have become more valuable as technology is decreasing in size. Non-volatile memory is often used in low power computing applications because non-volatile retains data when powered down. Some types of non-volatile memory have destructive read operations, which require a value that is read to be written back into memory. If power is lost during a read or write-back operation, the value originally stored in memory becomes malformed, corrupt, or otherwise no longer available.

SUMMARY

In described examples, data are stored in a destructive read non-volatile memory (DRNVM). The DRNVM includes an array of DRNVM cells organized as rows of data. The rows of data are subdivided into columns of code word symbols. Each column of code word symbols is encoded to store an error correction code symbol for each column of code word symbols.

DETAILED DESCRIPTION OF EXAMPLE EMBODIMENTS

Figure 1:
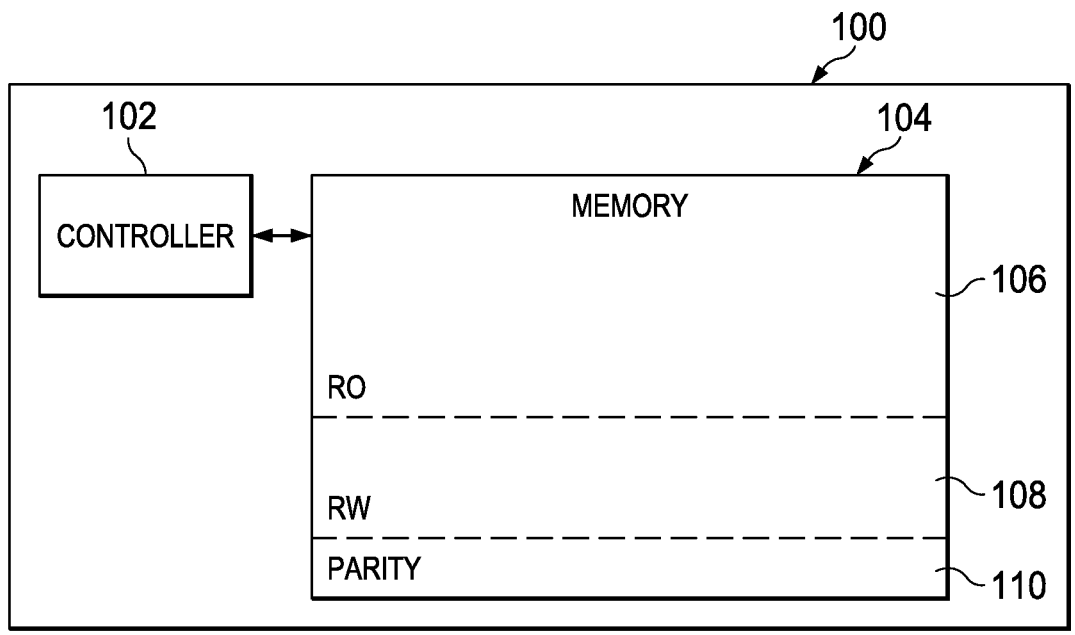
FIG. 1 is a block diagram illustrating an example device including an example controller in communication with an example memory array.

The example methods and apparatus described herein relate to correcting data symbol errors, which occur when memory is destroyed (e.g., destructed) due to power varying events during read, write, and/or write-back operations in destructive read non-volatile memory. As used herein, the term "power varying event" is defined to include any fluctuations in voltage, current, power, etc. including, without limitation, a complete loss of power (e.g., blackout), a decrease in power (e.g., brownout), an increase in power (e.g., power surge), or other fluctuations from a consistent supply of power.

During a typical digital device power-up process, such as may be carried out by a processor, the device connects to a power supply, allows the power supply to stabilize, boots from non-volatile memory, and begins normal operation. If a power varying event occurs during the power-up process, the device repeats the power-up process. If the content of the non-volatile memory is not affected by such power varying events, the power-up process restarts normally. However, if the device uses destructive read non-volatile memory ("DRNVM"), the content of the DRNVM may be malformed, affected, corrupted, or otherwise destroyed during a power varying event. This is because destructive read non-volatile memory requires values to be written-back into memory when the values are read. Thus, if a power varying event occurs when the destructive read non-volatile memory is attempting to write-back a value that was previously read, the destructive read non-volatile memory will not have the necessary power to complete the write-back, and an error will be introduced into the destructive read non-volatile memory.

Ferroelectric random access memory ("FeRAM") is a particular type of DRNVM. FeRAM provides numerous benefits including low power usage, fast read/write access, and high maximum number of read/write cycles (e.g., exceeding $10^{16}$ read/write cycle for 3.3 V devices). When FeRAM, and other DRNVM, is read, the content(s) of a memory row is retrieved and removed (e.g., destroyed) from the memory row. To maintain the content(s) of the memory row in DRNVM, a write-back operation is carried out after each read operation to replicate the contents of the memory cells that were read. If a power varying event occurs during the read and/or write-back operation, the content of the memory row in DRNVM is malformed, destroyed, corrupted, or otherwise unrecoverable. If the affected memory row contains program code (e.g., code necessary for initialization, boot code, operating system code, hardware test code, or similar code required to prepare the device for normal operation), destruction of the memory row can destroy critical operational programming. If any code necessary for operation is destroyed, the device may fail to start or otherwise fail to operate as expected. It is nearly impossible to determine what the particular program code was once the entirety of the memory row has been destroyed.

To prevent such destruction of memory rows and program code stored therein, known solutions detect a brownout condition and switch to alternative power, such as a charged capacitor. To ensure fast and proper power redistribution, the brownout detection circuit must detect a brownout within a short time frame (e.g., 1 nanosecond). Further, the capacitor requires power to become and remain charged in preparation of a brownout. For example, not only does a capacitor need to be charged, but because the charge of a capacitor degrades over time, additional power must be added or otherwise diverted to supplement the charge of the capacitor. In some examples, the capacitor must remain charged in preparation of a power varying event even where power varying events are rare. Thus, additional power is often wasted to maintain the charge of the capacitor.

Additionally, the capacitor must supply enough power to perform a write-back operation to an entire memory row. Therefore, the capacitor must be large and occupy a large surface area of the circuit (e.g., 0.3 square millimeters (0.3 mm$^2$), which, currently, is approximately the equivalent of 20,000 logic gates). Large components, such as the above-described capacitor, prevent a device from being made smaller and consume valuable surface area that may otherwise be reallocated to additional or alternate circuitry.

In contrast, the example methods and apparatus described herein correct destroyed memory (e.g., a memory read/write error) after a power varying event (e.g., a brownout) has already occurred. Thus, the example methods and apparatus advantageously correct destroyed memory rows and only use device resources when errors occur, instead of continuously charging a large capacitor to perform write-back operations.

To enable correction of destroyed memory, the example methods and apparatus restructure memory (e.g., DRNVM) and encode error correction code (e.g., Reed-Solomon code) in the restructured memory. In the illustrated example, the DRNVM memory is restructured prior to a power varying event occurring. For example, the example DRNVM memory for an example device may be restructured during manufacturing. Alternatively, the example DRNVM may be restructured when an example program is installed on the example device.

In the illustrated example, data symbols originally stored in DRNVM are encoded in Reed-Solomon ("RS") code in a finite field (e.g., Galois field ("GF")) GF($2^m$). RS code in GF($2^m$) can protect up to k=$2^m$−2t−1 m-bit symbols with 2t parity symbols, where t is the number of errors the RS code is capable of correcting (e.g. t is a design choice). Therefore, the total number of symbols in a code word (e.g., an RS code word) is n=k+2t=$2^m$−1. For example, if k m-bit data symbols (e.g., bytes) ($d_{k-1}$, $d_{k-2}$, . . . , $d_1$, $d_0$) are originally stored in memory, these data symbols are encoded into an n-length code word ($c_{n-1}$, $c_{n-2}$, . . . , $c_1$, $c_0$). Thereafter, the code words (e.g., which include the original data symbols) are stored back into the DRNVM.

The example methods and apparatus configure the code words (including the plurality of symbols ($c_{n-1}$, $c_{n-2}$, . . . , $c_1$, $c_0$)), to be stored in parallel columns within the DRNVM, such that only one symbol of a code word is stored in each row. For example, the example methods and apparatus configure a memory row to include a plurality of first symbols from a plurality of different code words. The example methods and apparatus configure the subsequent memory row to include a plurality of second symbols from the plurality of code words. Thus, if a brownout occurs during a read and/or write-back operation and a memory row is malformed, corrupted, or otherwise unrecoverable, only a single symbol from each code word will be malformed, corrupted, or otherwise unrecoverable. Thereafter, the example methods and apparatus described herein correct the malformed, corrupted, or otherwise unrecoverable symbol in each code word to reconstruct the original code words.

FIG. 1 illustrates an example device 100 including an example controller 102 in communication with an example memory 104. The example controller 102 controls data access to the example memory 104.

In the illustrated example, the example controller 102 is a memory controller, which is a digital circuit that includes multiplexers and de-multiplexers to identify and select row and column data addresses in the example memory 104, access the memory rows and/or columns, and perform read operations, write operations, write-back operations, and/or other known operations.

In the illustrated example, the example memory 104 is an FeRAM array with a destructive read operation (e.g., DRNVM). While the illustrated example is described with reference to FeRAM, other types of destructive read memory may be used without departing from the scope of this description. The example memory 104 is organized or otherwise restructured into three sections including an example read-only ("RO") section 106, an example read-write ("RW") section 108, and an example parity section 110. The example sections (e.g., RO section 106, RW section 108, and parity section 110) are illustrated in an example arrangement in FIG. 1, but any arrangement may be used.

In the illustrated example, the example RO section 106 is adjacent and above the example RW section 108, and the example RW section 108 is adjacent and above the example parity section 110. Alternatively, the example read-only ("RO") section 106, the example read-write ("RW") section 108, and the example parity section 110 may be ordered in an arrangement different than the arrangement of FIG. 1, so long as the example controller 102 can identify each section (e.g., the example controller 102 can distinguish the example parity section 110 from the example RO section 106).

Figure 2:
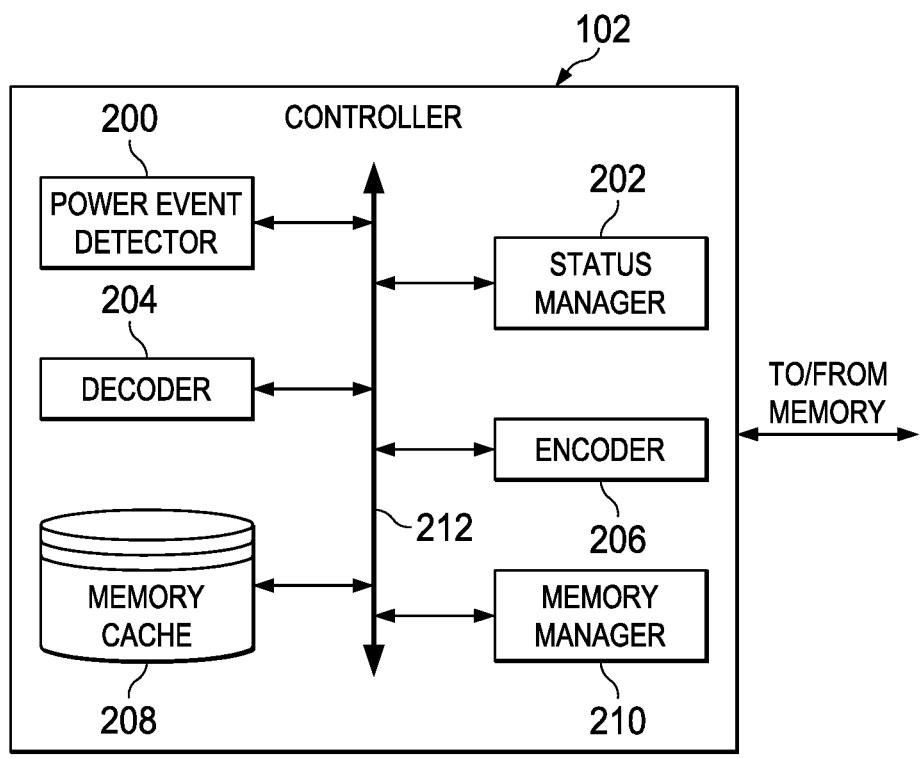
FIG. 2 is a block diagram illustrating the example controller of FIG. 1 including an example decoder and an example encoder.

FIG. 2 illustrates a block diagram of the example controller 102 of FIG. 1. The example controller 102 includes an example power event detector 200, an example status manager 202, an example decoder 204, an example encoder 206, an example memory cache 208, and an example memory manager 210. The example power event detector 200, the example status manager 202, the example decoder 204, the example encoder 206, the example memory cache 208, and the example memory manager 210 are all in communication via an example bus 212.

The example power event detector 200 is a circuit for detecting power varying events (e.g., a brownout). While the power event detector 200 is illustrated as part of the example controller 102, part or all of the power event detector 200 may alternatively be circuitry disposed outside of the example controller 102. In the illustrated example, the power event detector 200 identifies power varying events within a threshold time (e.g., 100 nanoseconds). After identifying a power varying event, the example power event detector 200 triggers a reboot, wherein the example device 100 restarts and initiates a power-up process. Once the power event detector 200 detects a power varying event, the example power event detector 200 communicates with the example memory manager 210 to prevent any further access to the example memory 104 before the example device 100 reboots. This ensures that only a single memory row (e.g., the memory row being accessed during the power varying event) is destroyed when a power varying event occurs during a write-back operation to the memory row.

The example status manager 202 managers the storage and erasure of a status signature. In the illustrated example, the status signature is an indication of the operational status of the example device 100 with respect to proper power-up and power-down. For example, if the example device 100 is powered-down correctly (e.g., not due to an unexpected power variation) then the example status manager 202 generates a "normal" status signature. Similarly, the example status manager 202 does not generate the "normal" status signature when the example device 100 is powered-down incorrectly (e.g., reset by the example power event detector 200 in response to a power varying event). Thus, the example status manager 200 stores a "normal" status signature into memory (e.g., example memory 104, other non-volatile memory, etc.) if no power varying events occur between power on (e.g., connecting the power supply) and power off (e.g., disconnecting the power supply) (see FIG. 6) of the example device 100.

When the example device 100 powers-up, the example status manager determines if a "normal" status signature is stored in memory after power to the example device 100 is stabilized. The example status manager 202 erases the "normal" status signature upon identification that status signature stored in memory is "normal." If a power varying event occurs after the "normal" status signature is erased, then the example status manager 202 will determine that a "normal" status signature is not stored in memory upon power-up. In such examples, the example status manger 204 identifies that the example device 100 was not powered down correctly, the example memory 104 likely has errors due to the improper power-down, and instructs the example decoder 204 to decode an error correction code that is encoded in the destructive read non-volatile memory (e.g., the example memory 104).

The example decoder 204 decodes an error correction code that is encoded in a destructive read non-volatile memory. In the illustrated example, the example decoder 204 calculates syndromes for code words stored in the example memory 104. A syndrome is an effect of an error characterized as a single-frequency wave in the frequency domain. The syndromes of a malformed code word (e.g., a code word with errors) can be calculated by evaluating the malformed code word with the primitive root of the finite field of the code word (e.g., $GF(2^m)$), discussed further in conjunction with FIG. 5. Each code word has 2t syndromes to be calculated. Thereafter, the example decoder 204 determines the number of errors (if any), the error locations, and the error magnitudes for each code word. Numerous decoder architectures may be used. In the illustrated example, a folded RS decoder architecture is used to share processing amongst all the code words (e.g., time division multiplexing). Alternatively, numerous processor and/or parallel processing may be used to decrease decoding times.

Figure 6:
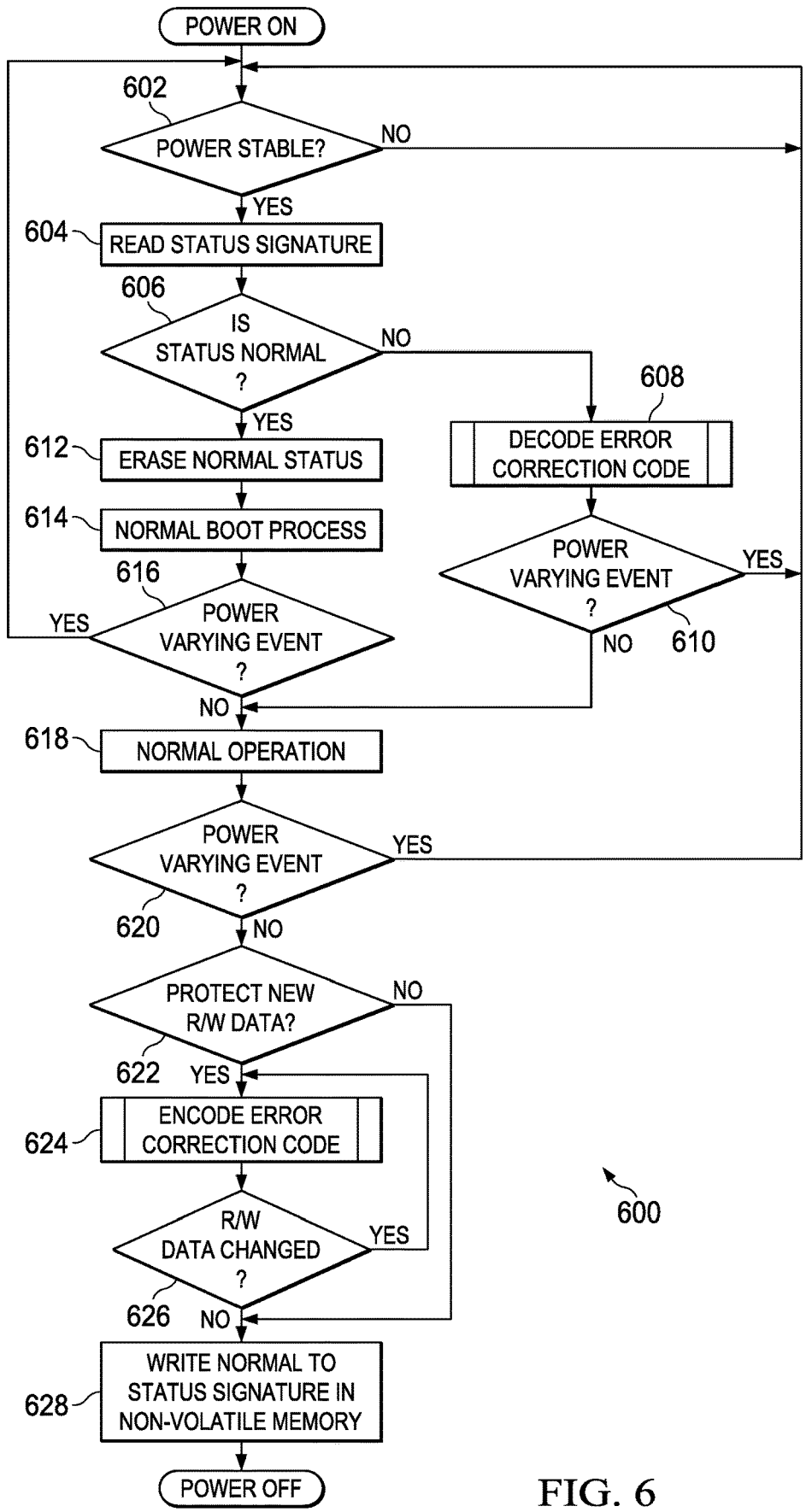
FIG. 6 is a flow chart illustrating example instructions to implement the example controller of FIGS. 1 and 2.

Initially, the example encoder 206 encodes the example memory 104 with error correcting code (e.g., RS code). As described above, RS code in $GF(2^m)$ can protect up to $k=2^m-2t-1$ m-bit symbols with 2t parity symbols, where t is the number of errors the RS code is capable of correcting. Therefore, the example encoder 206 encodes k data symbols into a code word of length n (e.g., $n=k+2t=2^m-1$). In the illustrated example, the example encoder 206 encodes example memory 104 with RS code prior to execution of the example program 600 (FIG. 6). For example, for t=3 errors and m=8 bits, the example encoder 206 encodes k=249 data symbols into a code word of length n=255 symbols.

In some examples, the example encoder 206 only encodes the example RO section 106. In the illustrated example, the example encoder 206 encodes both the example RO section 106 and the example RW section 108 of memory 104. Because RW data can change during normal operation (e.g., read-only memory can only be read, not written), the example encoder 206 subsequently encodes any changes in the data during the example program 600. In the illustrated example, the example encoder 206 is a delta encoder, which determines the difference between old data and new data (e.g., data has been updated).

The example memory cache 208 stores the k data symbols the example encoder 206 reads from the example memory 104. Additionally, the example memory cache 208 stores code words the example encoder 206 creates from the k data symbols. In the illustrated example, the example memory cache 208 is a tangible computer readable storage medium such as a CD-ROM, a floppy disk, a hard drive, a digital versatile disk (DVD), a Blu-ray disk, or other memory storage device or storage disk.

The example memory manager 210 controls read operations and write operations to the example memory 104. In the illustrated example, the example memory manager 210 restructures the example memory 104. For example, the example memory 104 may originally have k data symbols written into a memory row of the example memory 104. After the example encoder 206 creates code words based on the k data symbols, the example memory manager 210 retrieves the code words from the example memory cache 208 and writes the code words in column format in the example memory 104. Thus, the example memory manager 210 writes a first symbol for a first code word in a first row, a second symbol for the first code word in a second row, and so on. The example memory manager 210 writes each code word into the example memory 104 such that each code word is in a memory column instead of a memory row. In some examples, the example memory manager 210 stores multiple code words within each column. The example memory manager 210 additionally manages the loading of the boot process and normal operation (e.g., operating system) of the example device 100.

The example bus 212 enables communication between the example power event detector 200, the example status manager 202, the example decoder 204, the example encoder 206, the example memory cache 208, and the example memory manager 210.

In operation, the example encoder 206 converts data symbols into code words and stores the code words in the example memory cache 208. The example memory manager 210 organizes the example code words into parallel columns in the example memory 104. If the example device 100 (FIG. 1) powers down normally, the example status manager 202 writes a "normal" status signature into memory.

The example power event detector 200 identifies when a power varying event occurs (e.g., a brownout) and resets (e.g., disconnects and reconnects a power supply) the example device 100 (e.g., not a normal power down). When the example device 100 initializes, the example status manager 202 determines the status signature of the example device 100 (FIG. 1). When the status signature is not normal, the example decoder 204 decodes the code words to correct any errors that may have occurred due to the power varying event. When the status signature is normal, the example memory manage 210 loads the boot process for the example device 100, and if no power varying events occur, the normal operational code.

While an example manner of implementing the example controller 102 of FIG. 1 is illustrated in FIG. 2, one or more of the elements, processes and/or devices illustrated in FIG. 2 may be combined, divided, re-arranged, omitted, eliminated and/or implemented in any other way. Further, the example power event detector 200, the example status manager 202, the example decoder 204, the example encoder 206, the example memory cache 208, the example memory manager 210, the example bus 212, and/or, more generally, the example controller 102 of FIG. 2 may be implemented by hardware, software, firmware and/or any combination of hardware, software and/or firmware. Thus, for example, any of the example power event detector 200, the example status manager 202, the example decoder 204, the example encoder 206, the example memory cache 208, the example memory manager 210, the example bus 212, and/or, more generally, the example controller 102 of FIG. 2 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example power event detector 200, the example status manager 202, the example decoder 204, the example encoder 206, the example memory cache 208, the example memory manager 210, the example bus 212, and/or, more generally, the example controller 102 of FIG. 2 is/are hereby expressly defined to include a tangible computer readable storage device or storage disk such as a memory, a digital versatile disk (DVD), a compact disk (CD), a Blu-ray disk, etc. storing the software and/or firmware. Further still, the example controller of FIG. 1 may include one or more elements, processes and/or devices in addition to, or instead of, those illustrated in FIG. 2, and/or may include more than one of any or all of the illustrated elements, processes and devices.

Figure 3:
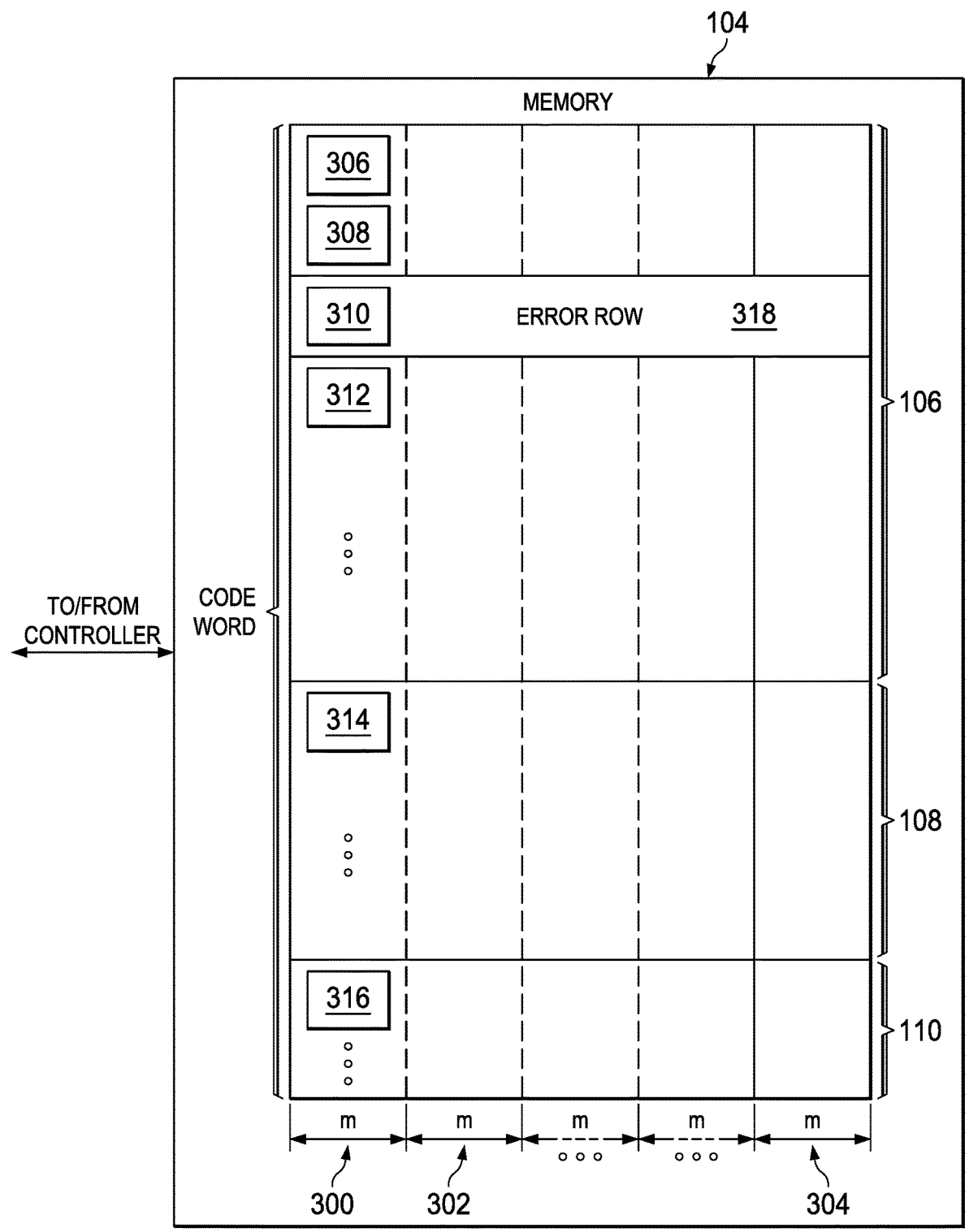
FIG. 3 is a block diagram illustrating the example memory of FIG. 1.

FIG. 3 is a block diagram illustrating the example memory 104 of FIG. 1. As discussed in conjunction with the example encoder 206 (FIG. 2) and the example memory manager 210 (FIG. 2), the example memory 104 is structured to contain parallel error correction encoded example code words 300, 302, 304. While three example code words 300, 302, 304 are indicated in FIG. 3, any number of code words may be created (e.g., ten code words). In the illustrated example, code word 300 has a plurality of example symbols 306, 308, 310, 312, 314, 316 that are m bits (e.g., 8 bits) in length (e.g., a memory row may contain ten symbols of 8 bits in length=an 80 bit wide memory row). In some examples, the example memory manager 210 stores multiple code words within each column (e.g., two symbols of length m/2 are stored in the column storing example code word 300). While six example symbols (e.g., example symbols 306, 308, 310, 312, 314, 316) are indicated in FIG. 3, the example code word 300 may have any number of symbols. In the illustrated example, the example code word 300 has n=k+2t symbols, where k=$2^m$−2t−1, m=bit length of the example symbols, and t=the number of errors to correct (e.g., design choice). In the illustrated example, t is selected, based on memory constraints (e.g., the higher the t the more parity symbols (2t) need to be added to the code word). In the illustrated example, t can be small (e.g., 3) because the example methods and apparatus ensure that only a single memory row (e.g., a single error per code word) is destructed when a power varying event occurs. It is improbable for more than two errors to occur because a first power varying event would have to cause a first error (e.g., a destructed symbol) and then during correction of the first error, a second power varying event would have to cause a second error before the first error was corrected.

In the illustrated example, an example memory row 318 may be destructed due to a power varying event occurring during a read, write, and/or write-back operation to the example memory 104. The example memory row 318 may be referred to as an error row, as the symbols (e.g., example symbol 310) within the example memory row 318 are destroyed, unrecoverable, or otherwise erroneous. In the illustrated example, the destruction of the example memory row 318 occurred within the example RO section 106 during a read and/or write-back operation. The example RW section 108 is also subject to an error row, if a power varying event occurs when the example memory manager 210 (FIG. 2) is reading, writing-back read data, and/or writing new data in the example RW section 108. The example parity section 110 is also subject to an error row if a power varying event occurs during decoding of RO/RW data or encoding new RW data.

Figure 4:
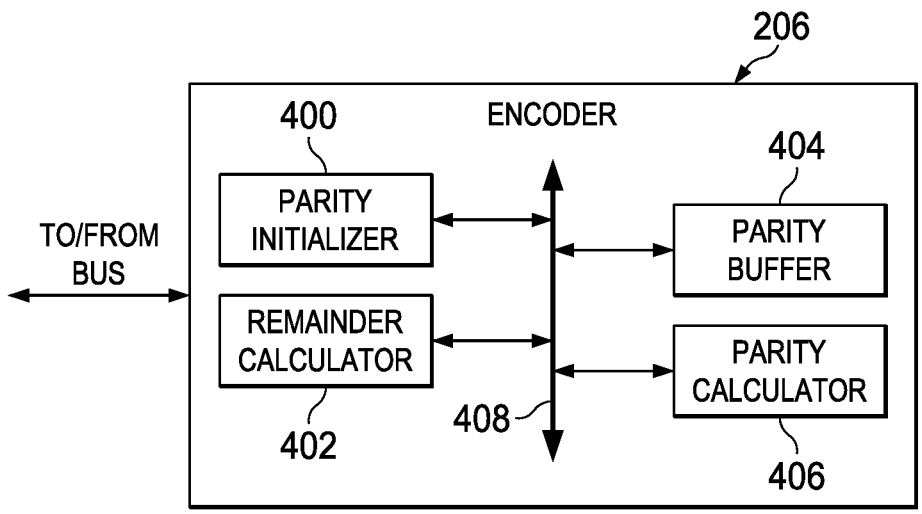
FIG. 4 is a block diagram illustrating the example encoder of FIG. 2.

FIG. 4 is a block diagram illustrating the example encoder 206 of FIG. 2. The example encoder 206 includes an example parity initializer 400, an example remainder calculator 402, an example parity buffer 404, and an example parity calculator 406. The example parity initializer 400, the example remainder calculator 402, the example parity buffer 404, and the example parity calculator 406 all in communication via a bus 408. The example encoder 206 encodes the example RO section 106 and the example RW section 108 of the example memory 104 and encodes new data that is written into the example RW section 108.

As described herein, RS code can encode k=$2^m$−2t−1, m-bit symbols with 2t parity symbols. To encode the example memory 104 with RS code, the example parity initializer 400 determines the 2t parity symbols based on the k data symbols stored in the example memory 104. The k data symbols can be expressed as a data polynomial according to Equation 1:

$$d(x)=\Sigma_{i=0}^{k-1} d_i x^{k-1-i} \qquad \text{Equation 1}$$

Similarly, the parity symbols can be expressed in a parity polynomial according to Equation 2:

$$p(x)=d(x)\cdot x^{n-k} \bmod g(x) \qquad \text{Equation 2}$$

In Equation 2, g(x) is the generator polynomial (e.g., $g(x)=\Pi_{j=1}^{n-k}(x-\alpha^j)$, where α is a primitive root of the field $GF(2^{2m})$). In the illustrated example, the parity initializer 400 determines the parity polynomial based on Equation 2 (e.g., the remainder of the data polynomial multiplied by $x^{n-k}$ and divided by the generator polynomial). The parity initializer 400 creates an example code word (e.g., c(x)) according to Equation 3:

$$c(x)=d(x)\cdot x^{n-k}-p(x)=d(x)\cdot x^{n-k}-d(x)\cdot x^{n-k} \bmod g(x) \qquad \text{Equation 3}$$

In the illustrated example, the example code word is stored in the example memory cache 208 (FIG. 2). The parity initializer 400 does this process for each memory row of the example memory 104. As described above, the example memory manager 210 (FIG. 2) restructures the example memory 104 with the code words stored in the example memory cache 208.

When new data is written to the example RW section 108 of the example memory 104, the example remainder calculator 402 determines the polynomial remainder between new data and old data. The example remainder calculator 402 first determines the difference between the new data (e.g., in polynomial format d'(x) according to Equation 1) and the old data (e.g., in polynomial format d(x) according to Equation 1) according to Equation 4:

$$\delta(x)=d'(x)-d(x)=\Sigma_{l\in\{d_l \ne d'_l\}} \delta_l x^{k-1-l} \qquad \text{Equation 4}$$

where $\delta_i = d'_i - d_i$

The example remainder calculator 402 then determines the polynomial remainder (e.g., r(x)) according to Equation 5:

$$r(x)=\delta(x)\cdot x^{n-k} \bmod g(x) \qquad \text{Equation 5}$$

The example remainder calculator 402 outputs the polynomial remainder to the example parity calculator 406. The number of delta elements included in the above calculations can depend on complexity and/or memory bandwidth.

The example parity buffer 404 initially reads the example parity section 110 of the example memory 104 and stores the parity polynomial. The example parity buffer 404 receives updated parity polynomials from the example parity calculator 406 when the parity polynomial is recalculated, such as after the example memory 104 has new data written to the example RW section 108. The example parity buffer 404 reads the example parity section 110 of the example memory 104 once and is continuously updated by the example parity calculator 406 thereafter, so that the example parity buffer 404 does not have to continuously read the example parity section 110 of the example memory 104 (e.g., introducing more opportunities for data to be malformed or corrupted due to a power varying event). The example parity buffer 404 outputs the parity polynomial to the example parity calculator 406.

The example parity calculator 406 combines (e.g., using an adder in $GF(2^m)$) the output of the example remainder calculator 402 with the parity polynomial stored in the example parity buffer 404. The example parity calculator 406 determines a new parity polynomial according to Equation 6:

$$p'(x)=p(x)+r(x)=p(x)+\delta(x)\cdot x^{n-k} \bmod g(x) \qquad \text{Equation 6}$$

The example remainder calculator 402 updates the parity buffer 404 and the parity section 110 of the example memory 104 with the new parity polynomial p'(x). Additionally, a new code word (e.g., c'(x)) can be determined by inserting d'(x) and p'(x) into Equation 3.

In operation, the example encoder 206 initializes the example memory 104 with error correction code (if the example memory 104 is not already encoded with error correction code). The example parity initializer 400 determines 2t parity symbols associated with k data symbols and uses Equation 3 to create a code word (e.g., an RS code word). Thereafter, the example encoder 206 encodes additional data that changes during operation of the example device 100 (FIG. 1). For example, if the example device 100 writes new data into the example RW section 108 of the example memory, the example parity calculator 406 encodes the new data by combining the polynomial remainder corresponding to the difference between the new data and the old data with the parity polynomial stored in the example parity buffer 404. The new data is associated with the updated parity polynomial (e.g., via Equation 3) to create a new code word for the new data.

While an example manner of implementing the example encoder 206 of FIG. 2 is illustrated in FIG. 4, one or more of the elements, processes and/or devices illustrated in FIG. 4 may be combined, divided, re-arranged, omitted, eliminated and/or implemented in any other way. Further, the example parity initializer 400, the example remainder calculator 402, the example parity buffer 404, the example parity calculator 406, the example bus 408 and/or, more generally, the example encoder 206 of FIG. 4 may be implemented by hardware, software, firmware and/or any combination of hardware, software and/or firmware. Thus, for example, any of the example parity initializer 400, the example remainder calculator 402, the example parity buffer 404, the example parity calculator 406, the example bus 408 and/or, more generally, the example encoder 206 of FIG. 4 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example parity initializer 400, the example remainder calculator 402, the example parity buffer 404, the example parity calculator 406, the example bus 408 and/or, more generally, the example encoder 206 of FIG. 4 is/are hereby expressly defined to include a tangible computer readable storage device or storage disk such as a memory, a digital versatile disk (DVD), a compact disk (CD), a Blu-ray disk, etc. storing the software and/or firmware. Further still, the example encoder of FIG. 2 may include one or more elements, processes and/or devices in addition to, or instead of, those illustrated in FIG. 4, and/or may include more than one of any or all of the illustrated elements, processes and devices.

Figure 5:
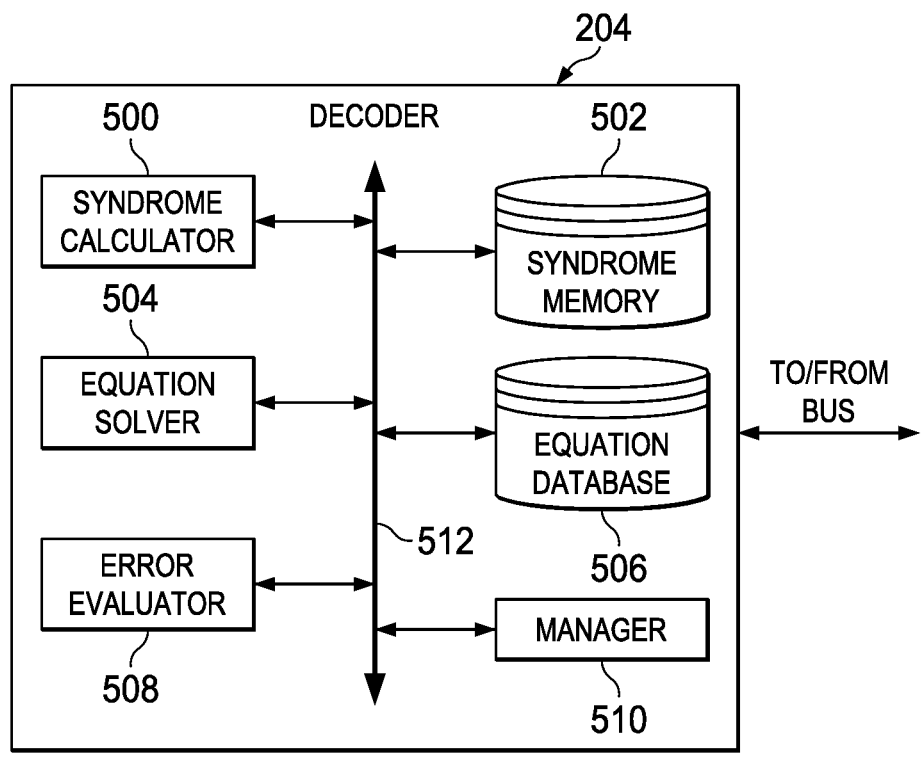
FIG. 5 is a block diagram illustrating the example decoder of FIG. 2.

FIG. 5 is a block diagram illustrating the example decoder 204 of FIG. 2. The example decoder 204 includes an example syndrome calculator 500, an example syndrome memory 502, an example equation solver 504, an example equation database 506, an example error evaluator 508, and an example manager 510. The example syndrome calculator 500, the example syndrome memory 502, the example equation solver 504, the example equation database 506, the example error evaluator 508, and the example manager 510 all in communication via an example bus 512. The example decoder 204 corrects errors in code words formed as a result of a power varying event during a read and/or write-back operation.

In the illustrated example, the example decoder 204 is a Berlekamp-Massey decoder. The Berlekamp-Massey algorithm ("BM algorithm") is an iterative procedure for decoding Reed-Solomon error correction code and correcting errors identified in the decoding process. Alternatively, other error-correcting codes and decoders may be used without departing from the scope of this description. Further, the example decoder 204 uses a folded decoder architecture, wherein the example syndrome calculator 500, the example equation solver 504, and the example error evaluator 508 share processing amongst the code words via time division multiplexing (e.g., time share). Alternatively, other decoder architectures may be used, such as Peterson, Blahut, Berlekamp, Euclidean, etc.

The example decoder 204 corrects errors in a malformed (e.g., corrupted, destructed, destroyed, or otherwise unrecoverable) code word (e.g., m(x)) due to a power varying event occurring during a read, write, and/or write-back operation in the example memory 104 according to Equation 7:

$$c(x)=m(x)-e(x) \qquad \text{Equation 7}$$

where e(x) is an error polynomial

As the malformed code word (e.g., m(x)) can be read from the example memory 104 after a power varying event has destructed the original code word (e.g., c(x)), the example decoder 204 determines the error polynomial (e.g., e(x)) and removes the error polynomial from the malformed code word to obtain the original code word (e.g., c(x)). The example decoder 204 determines the error polynomial by calculating the error locator polynomial (e.g., using the BM algorithm), determining the roots of the error locator polynomial (e.g., using the Chien Search), and determining the error values (e.g., using Forney algorithm). The error locator polynomial requires calculating the syndromes of the malformed code word.

The example syndrome calculator 500 determines the syndromes of the malformed code word (e.g., m(x)) by evaluating the malformed code word at powers of a (e.g., the primitive root of $GF(2^m)$) according to Equation 8:

$$s_i=m(\alpha^i) \text{ for } i=1,2,\ldots,n-k \qquad \text{Equation 8}$$

The example syndrome calculator 500 selects $\alpha^i$ values to enter into Equation 8 by retrieving values from an $\alpha^i$ look up table in the example equation database 506. The example syndrome calculator 500 calculate 2t syndromes for each code word. The example syndrome calculator 500 stores the calculated syndromes in the example syndrome memory 502. The example syndrome memory 502 stores the syndromes in parallel columns, wherein each column is configured as a circular buffer. For C code words, the example syndrome memory 502 has 2t*C m-bit values. For each code word, the example syndrome calculator creates a syndrome polynomial (e.g., S(x)) using Equation 1 and replacing $d_i$ with $s_i$.

In the illustrated example, the example equation solver 504 determines the error locator polynomial by solving Equation 10 using the BM algorithm.

$$\Lambda(x)S(x) \equiv \Omega(x) \bmod x^{2t} \qquad \text{Equation 10}$$

where $\Lambda(x) = 1 + \sum_{i=1}^{L} \lambda_i x^i$

The example equation solver 504 determines a minimal degree of L and $\Lambda(x)$ in Equation 11 in which z=0:

$$z = S_q + \Lambda_1 S_{q-1} + \ldots + \Lambda_L S_{q-L} \qquad \text{Equation 11}$$

for all syndromes q=L to (Q-1)

The example equation solver 504 initializes $\Lambda(x)$ to one, L is the assumed number of errors (e.g., initially zero), and Q is the total number of syndromes (e.g., each code word has 2t syndromes). For each q iteration, the example equation solver 504 calculates a discrepancy (e.g., z) according to Equation 11. When z≠0, the example equation solver 504 adjusts $\Lambda(x)$ to try and get z to equal zero according to Equation 12:

$$\Lambda(x) = \Lambda(x) - \left(\frac{z}{b}\right) x^{q-s} B(x) \qquad \text{Equation 12}$$

where b is a copy of the last discrepancy z since L was updated, B(x) is a copy of $\Lambda(x)$ since L was updated, and s is the iteration on which L was updated. As this process is iterative, the example equation solver 504 stores $\Lambda(x)$, B(x), z, b, q, and/or s values in the example equation database 506. L is increased until z=0 before q becomes greater than or equal to 2L. The example equation solver 504 determines the minimal degree of $\Lambda(x)$ to be the error locator polynomial. From the error locator polynomial, the number of errors can be determined by the number of zero crossings (e.g., where the error locator polynomial equals zero). For example, a polynomial with a highest power of $x^2$ has two zero crossings, and thus would indicate two errors. If there are no zero crossings (e.g., $x^0$ is the highest power), then the example equation solver 504 retrieves the next malformed code word to decode. The example equation solver 504 determines $\Omega(x)$ based on the minimal degree of $\Lambda(x)$. While the example equation solver 504 is discussed in conjunction with the BM algorithm, alternative algorithms may be used to determine the error locator polynomial.

As described herein, the example equation database 506 stores values used to determine the error locator polynomial (e.g., $\Lambda(x)$, B(x), z, b, q, and/or s). Additionally, the example equation database 506 includes look up tables to determine $\alpha^i$ and $\alpha^{-i}$ values.

In the illustrated example, the example error evaluator 508 determines the roots of the error locator polynomial using the Chien search. (e.g., where $\Lambda(\alpha^{-i})=0$, then $\alpha^i$ is one of the error locations and thus $m_i$, is where the error occurred in the malformed code word). The example error evaluator 508 can determine $\alpha^{-i}$ quickly by retrieving values from an $\alpha^{-i}$ look up table in the example equation database 506. Once the error evaluator 508 determines the roots, these values can be inserted into the Forney algorithm to determine the error values (e.g., $e_i$).

In the illustrated example, the example error evaluator 508 solves Equation 13 to determine the error values based on the roots $m_i$ determined by the Chien search.

$$e_i = -\frac{\Omega(m_i)}{\Lambda'(m_i)} \qquad \text{Equation 13}$$

where $\Lambda'(x)$ is the formal derivative of $\Lambda(x)$ (e.g., $\Lambda'(x) = \lambda_1 + \lambda_3 x^3 + \ldots$ for $GF(2^m)$). Alternatively, the example error values may be determined by solving the linear system of:

$$s_i = e_i \alpha^{ij} \text{ for } i \geq 0; j \geq 0 \qquad \text{Equation 14}$$

Once the example error evaluator 508 identifies the error values (e.g., $e_i$), the example error evaluator 508 create the error polynomial e(x) using Equation 1 and substituting $d_i$ with $e_i$.

The example manager 510 identifies the number of errors identified by the example equation solver and updates an error counter numerating the same. The example manager identifies the error polynomial determined by the error evaluator. The example manager 510 corrects the identified errors by removing the error polynomial (e.g., e(x)) from the malformed code word (e.g., m(x)) to recover the original code word (e.g., c(x)) according to Equation 7. Once the example manager 510 corrects the errors, the example manager 510 resets the error counter to zero.

If the example power event detector 200 (FIG. 2) detects a power varying event when the example decoder 204 is correcting a malformed code word, the example error counter would not be reset. Accordingly, the example decoder 204 identifies when multiple errors occur and can correct up to t errors within a code word.

In operation, the example decoder 204 minimizes the number of read operations to the example memory 104 during the decoding. Accordingly, the example syndrome calculator 500 reads all rows associated with a malformed code word at one time. The example syndrome calculator 500 calculates the syndromes for all the code words in parallel. The example syndrome calculator 500 stores the code words and their syndrome in the example syndrome memory 502. Thereafter, for each code word, the equation solver 504 determines the error locator polynomial, the example error evaluator 508 determines the error locations and error values, and the example error evaluator 508 creates the error polynomial and outputs it to the example manager 510. The example manager 510 retrieves the malformed code words from the example syndrome memory 502 and removes the example error polynomials from the malformed code words to recover the original code words.

While an example manner of implementing the example decoder 204 of FIG. 2 is illustrated in FIG. 5, one or more of the elements, processes and/or devices illustrated in FIG. 5 may be combined, divided, re-arranged, omitted, eliminated and/or implemented in any other way. Further, the example syndrome calculator 500, the example syndrome memory 502, the example equation solver 504, the example equation database 506, the example error evaluator 508, the example manager 510, the example bus 512 and/or, more generally, the example decoder 204 of FIG. 5 may be implemented by hardware, software, firmware and/or any combination of hardware, software and/or firmware. Thus, for example, any of the example syndrome calculator 500, the example syndrome memory 502, the example equation solver 504, the example equation database 506, the example error evaluator 508, the example manager 510, the example bus 512 and/or, more generally, the example decoder 204 of FIG. could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example syndrome calculator 500, the example syndrome memory 502, the example equation solver 504, the example equation database 506, the example error evaluator 508, the example manager 510, the example bus 512 and/or, more generally, the example decoder 204 of FIG. 5 is/are hereby expressly defined to include a tangible computer readable storage device or storage disk such as a memory, a digital versatile disk (DVD), a compact disk (CD), a Blu-ray disk, etc. storing the software and/or firmware. Further still, the example decoder of FIG. 2 may include one or more elements, processes and/or devices in addition to, or instead of, those illustrated in FIG. 5, and/or may include more than one of any or all of the illustrated elements, processes and devices.

Figure 7:
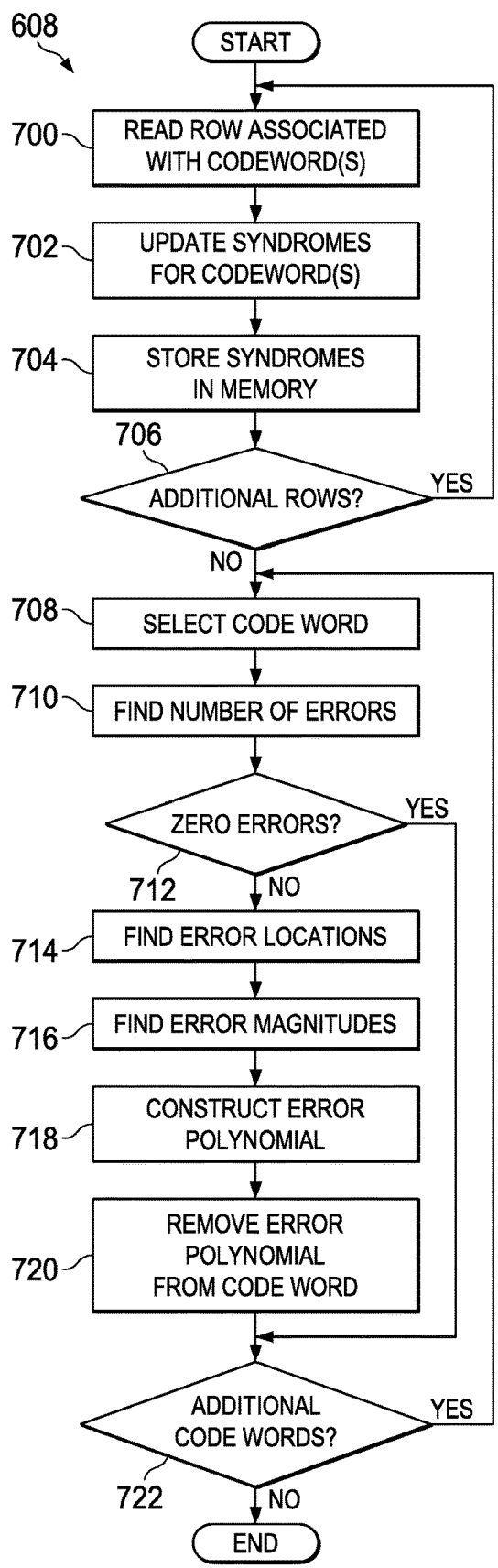
FIG. 7 is a flow chart illustrating example instructions to implement the example decoder of FIG. 4.
Figure 8:
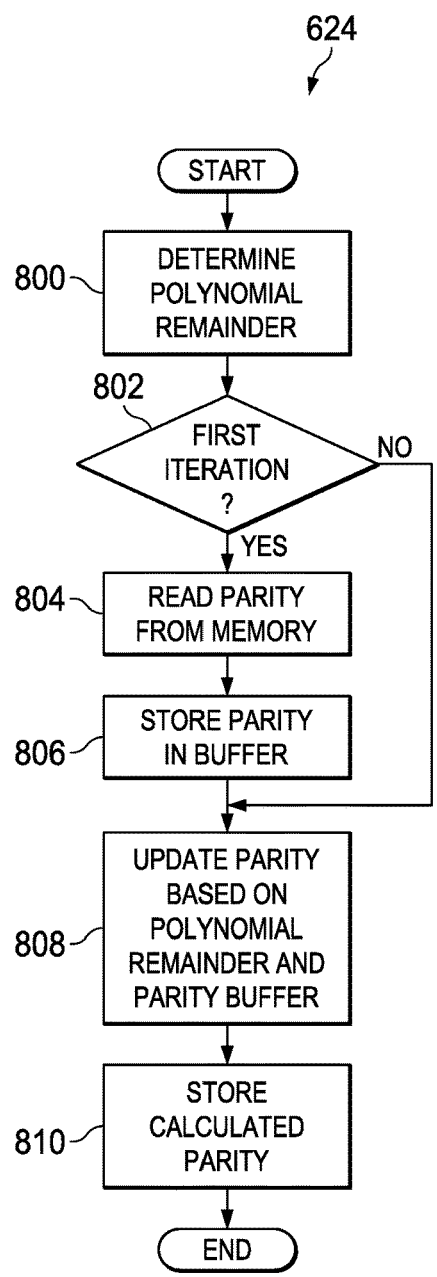
FIG. 8 is a flow chart illustrating example instructions to implement the example encoder of FIG. 5.

Flowcharts representative of example machine readable instructions for implementing the example controller 102 of FIGS. 1-2 is shown in FIGS. 6-8. In this example, the machine readable instructions comprise programs for execution by a processor such as the processor 912 shown in the example processor platform 900 discussed below in connection with FIG. 9. The programs may be embodied in software stored on a tangible computer readable storage medium such as a CD-ROM, a floppy disk, a hard drive, a digital versatile disk (DVD), a Blu-ray disk, or a memory associated with the processor 912, but the entire programs and/or parts thereof could alternatively be executed by a device other than the processor 912 and/or embodied in firmware or dedicated hardware. Further, although the example programs are described with reference to the flowcharts illustrated in FIGS. 6-8, many other methods of implementing the example controller 102 may alternatively be used. For example, the order of execution of the blocks may be changed, and/or some of the blocks described may be changed, eliminated, or combined.

As described above, the example processes of FIGS. 6-8 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and transmission media. As used herein, "tangible computer readable storage medium" and "tangible machine readable storage medium" are used interchangeably. Additionally or alternatively, the example processes of FIGS. 6-8 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and transmission media. As used herein, when the phrase "at least" is used as the transition term in a preamble of a claim, it is open-ended in the same manner as the term "comprising" is open ended.

FIG. 6 is a flow chart illustrating an example program 600 to implement the example controller 102 of FIGS. 1-2. In the illustrated example, example program 600 operates between power on and power off of the example device 100. At block 602, the example power event detector 200 determines if there is a stable power supply (e.g., whether there is a power varying event such as a brownout). If the example power event detector 200 determines that the power supply is not stable (block 602: NO), then the example program 600 loops until the power supply is stable (e.g., block 602: YES). If the example power event detector 200 determines that the power supply is stable (block 602: YES), then the example status manager 202 reads a status signature stored in memory (e.g., DRNVM, other non-volatile memory, etc.) (block 604). Thereafter, the example status manager 202 determines whether the status signature is "normal" (block 606).

If the example status manager 202 determines that the status signature is not "normal" (block 606: NO), then control proceeds to block 608. At block 608, the example decoder 204 decodes error correction code encoded within the example memory 104. At block 610, the example power event detector 200 determines whether a brownout occurs during the decoding by the example decoder 204. If the example power event detector 200 determines that a brownout occurs during the decoding (block 610: YES), then the example device 100 (FIG. 1) resets (e.g., disconnects and reconnects a power supply) and control returns to block 602.

If the example status manager 202 determines that the read status is "normal" (block 606: YES), then control proceeds to block 612. At block 612, the example status manager 202 erases the "normal" status signature from memory (block 612). Thereafter, the example memory manager 210 allows the normal boot process of the example device 100 to initialize (e.g., loads the boot process from memory) (block 614). At block 616, the example power event detector 200 determines whether a power varying event occurs during the normal boot process. If the example power event detector 200 determines that a power varying event occurs during the normal boot process (block 616: YES), then the example device 100 resets and control returns to block 602. If the example power event detector 200 determines that no power varying event occurs (block 616: NO and/or block 610: NO), then control proceeds to block 618.

At block 618, the example memory manager 210 allows normal operation to commence (e.g., loads the operating system, loads an example program, etc.). However, the example power event detector 200 operates in parallel with normal operation to determine whether a power varying event occurs during normal operation (block 620). If the example power event detector 200 determines that a power varying event occurs during normal operation (block 620: YES), then the example device 100 resets and control returns to block 602. However, if example power event detector 200 determines that no power varying event occurs (block 620: NO), then control proceeds to block 622.

The example blocks 610, 616, and 620 are shown in particular locations of the example program 600 for illustrative purposes to determine if a power varying event occurs during critical portions of the example program 600. However, the example power event detector 200 may determine that a power varying event occurs during other portions of the example program 600. Therefore, anytime a power varying event occurs, the example device 100 resets and control returns to block 602. Otherwise, the example program 600 operates as illustrated and described in conjunction with FIG. 6.

At block 622, the example memory manager 210 determines if new RW data is to be protected with error correction code. If new RW data is to be protected (block 622: YES), then the example encoder 206 encodes the new RW data with error correction code (block 624). At block 626, the example memory manager 210 determines if the RW data has changed since the last RW data encoding. If the RW data has changed (block 626: YES), the example encoder 206 encodes the new RW data (block 624). This process may continue until the RW data has not changed (block 626: NO). If RW is not to be protected (block 622: NO) and/or the RW data has not changed (block 626: NO), control proceeds to block 628.

At block 628, the example status manager writes "normal" as a status signature into memory (e.g., DRNVM, other non-volatile memory, etc.). In the illustrated example, a "normal" status is written when no power varying event has occurred during execution of the example program 600 (e.g., block 610: NO, block 616: NO, block 620: NO, etc.). Thus, as illustrated in FIG. 6, the decoding of the example memory 104 (block 608) is performed when the example device 100 was not powered off properly (e.g., reset due to a power varying event). After the example status manager writes "normal" as a status signature, the example device 100 powers off. In the illustrated example, power off refers to the example device 100 powering down under normal circumstances (e.g., user initiated power off, software update causing the device 100 to reboot, or otherwise receiving an instruction to disconnect the power supply) as opposed to a power varying event (e.g., brownout, black out, accidental power removal, short circuiting, etc.) as described herein.

FIG. 7 is a flow chart illustrating an example implementation of block 608 to decode error correction code encoded destructive read non-volatile memory. The example implementation of block 608 is implemented after a power varying event occurs during a read, write, and/or write-back operation and begins at block 700. At block 700, the example syndrome calculator 400 reads a first memory row of the example memory 104 (FIG. 3) (block 700). Because each row contains a plurality of symbols from a plurality of code words, reading an entire memory row retrieves one symbol per code word. Accordingly, the example syndrome calculator 400 can update syndromes for each symbol of each code word in the first memory row (block 702). In the illustrated example, the example syndrome calculator 400 updates the syndromes of all the code words at the same time. Thereafter, the example syndrome calculator 400 stores the syndromes in the example syndrome memory 402 (FIG. 2) (block 704).

At block 706, the example syndrome calculator determines whether there are additional rows in the example memory 104. If there are additional rows in the example memory 104 (block 706: YES), control returns to block 700.

If there are no additional rows in the example memory 104 (block 706: NO), then control proceeds to block 708. At block 708, the example manager 410 selects a first code word (e.g., the first column of the example memory 104) and control proceeds to block 710. The first code word is suspected to be malformed in some way, such as one or more symbols being erroneous.

At block 710, the example equation solver 404 minimizes the error locator polynomial to find the number of errors in the first code word (if any) (e.g., number of zero crossings in the error locator polynomial). If the example equation solver 404 determines there are zero errors (block 712: YES), control proceeds to block 722. If the example equation solver 404 determines there are errors (block 712: NO), then the example error evaluator 408 identifies the error locations by identifying the roots associated with the zero crossings (block 714). The example error evaluator 408 determines the error magnitudes associated with the roots (block 716). The example error evaluator 408 combines the error locations (e.g., $x^3$ and $x^4$) with the error magnitudes (e.g., 15, 42) to construct an error polynomial (e.g., $15 x^3+42 x^4$) (block 718). At block 720, the example manager 410 removes the error polynomial from the first code word. Thereafter, the example manager 410 determines whether there are additional code words to decode (block 722). If the example manager 410 determines there are additional code words to decode (block 722: YES), then control returns to block 708. If the example manager 410 determines there are no additional code words to decode (block 722: NO), then the example implementation of block 608 ceases. In the illustrated example, the example implementation of block 608 decodes and corrects errors one code word at a time via time division multiplexing of the example equation solver 404 and the example error evaluator 408. Alternatively, to decode at a faster rate, the example equation solver 404 and the example error evaluator 408 can process the example code words via parallel processing.

FIG. 8 is a flow chart illustrating example implementation of block 626. The example implementation of block 626 begins at block 800. At block 800, the example remainder calculator 500 determines the polynomial remainder. For example, the example remainder calculator 500 receives a previously stored symbol (e.g., $d_i$) and a new stored symbol (e.g., $d'_i$) and determines the difference (e.g., $\delta_i$) between them (e.g., $\delta_i = \delta'_i - d_i$). The example remainder calculator 500 determines the polynomial remainder by creating a polynomial from the above identified differences (e.g., $\delta(x) = \sum_{i \in \{d_i \neq d'_i\}} \delta_i x^{k-1-i}$). At block 802, the example parity buffer 502 determines (e.g., based on its contents (e.g., no contents upon the example device initializing), based on a counter, etc.) whether this is the first iteration of the example implementation of block 626. If this is the first iteration (block 802: YES), then the example parity buffer 502 reads the parity (e.g., the parity polynomial p(x)) from the example parity section 110 in the example memory 104 (block 804). The example parity buffer 502 stores the parity (block 806).

If this is not the first iteration (block 802: NO), then control proceeds to block 808. Thereafter, the example parity calculator 504 updates the parity (e.g., p'(x)) based on the polynomial remainder (e.g., $\delta(x)$) determined in block 800 and the parity (e.g., p(x)) stored in the example parity buffer 502 (e.g., $p'(x) = p(x) + \delta(x) \cdot x^{n-k} \mod g(x)$) (block 810). The example parity calculator 504 stores the updated parity (e.g., p'(x)) in the example parity section 110 in the example memory 104 and in the example parity buffer 502. Thereafter, the example implementation of block 626 ceases. By updating the parity in both the example memory 104 and the example parity buffer 502, the example implementation of block 626 avoids constant reading the parity from the example memory 104. As described herein, each read operation is destructive and must be written back to ensure the contents remain in memory. Introducing additional read operations increases the likelihood that a power varying event will occur during one of the read operations. Therefore, the example implementation of block 626 reduces the number of read operations to example memory 104 using the example parity buffer 502.

Figure 9:
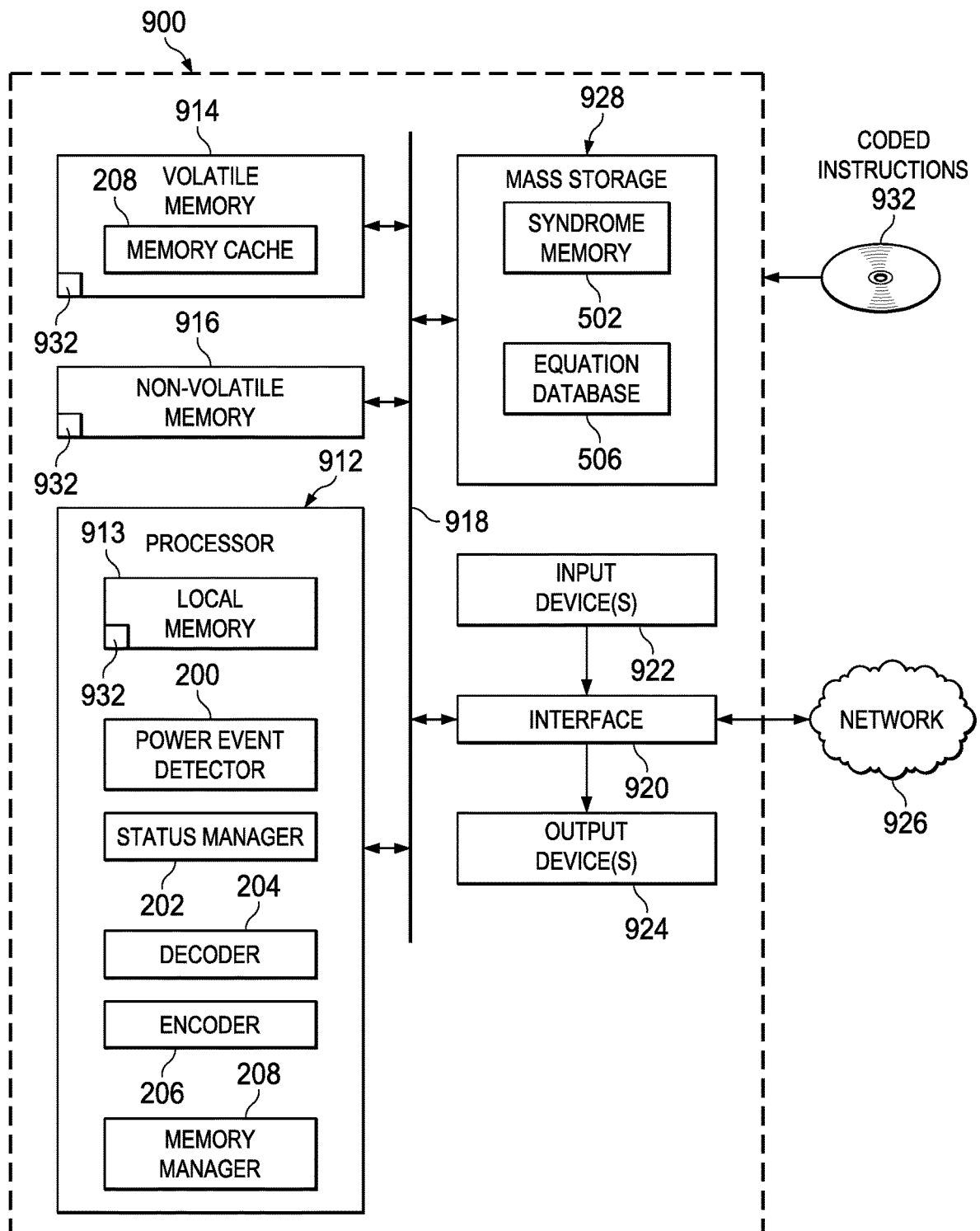
FIG. 9 is a block diagram of an example processor platform to implement the example flow charts of FIGS. 6-8.

FIG. 9 is a block diagram of an example processor platform 900 capable of executing the instructions of FIGS. 6-8 to implement the example controller 102 of FIGS. 1-2. The processor platform 900 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 900 of the illustrated example includes a processor 912. The processor 912 of the illustrated example is hardware. For example, the processor 912 can be implemented by one or more integrated circuits, logic circuits, microprocessors or controllers from any desired family or manufacturer.

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 916 may be implemented by flash memory and/or any other desired type of memory device. Access to the main memory 914, 916 is controlled by a memory controller.

The processor platform 900 of the illustrated example also includes an interface circuit 920. The interface circuit 920 may be implemented by any type of interface standard, such as an Ethernet interface, a universal serial bus (USB), and/or a PCI express interface.

In the illustrated example, one or more input devices 922 are connected to the interface circuit 920. The input device(s) 922 permit(s) a user to enter data and commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 920 of the illustrated example, thus, typically includes a graphics driver card, a graphics driver chip or a graphics driver processor.

The interface circuit 920 of the illustrated example also includes a communication device such as a transmitter, a receiver, a transceiver, a modem and/or network interface card to facilitate exchange of data with external machines (e.g., computing devices of any kind) via a network 926 (e.g., an Ethernet connection, a digital subscriber line (DSL), a telephone line, coaxial cable, a cellular telephone system, etc.).

The processor platform 900 of the illustrated example also includes one or more mass storage devices 928 for storing software and/or data. Examples of such mass storage devices 928 include floppy disk drives, hard drive disks, compact disk drives, Blu-ray disk drives, RAID systems, and digital versatile disk (DVD) drives.

The coded instructions 932 of FIGS. 6-8 may be stored in the mass storage device 928, in the volatile memory 914, in the non-volatile memory 916, and/or on a removable tangible computer readable storage medium such as a CD or DVD.

From the foregoing, the above described methods, apparatus, and articles of manufacture provide low power error correction for destructive read non-volatile memory. The example methods and apparatus avoid charging and maintaining replacement power solutions by allowing errors to occur and correcting them rather than preventing them from occurring. The example methods, apparatus, and articles of manufacture restructure data stored in memory rows into memory columns and encode the data with error correction code. The example methods and apparatus detect power varying events which cause errors in memory rows, reset the device, and correct the errors in the erroneous memory row by decoding the error correction code.

Modifications are possible in the described embodiments, and other embodiments are possible, within the scope of the claims.

What is claimed is:

1. A destructive read non-volatile memory (DRNVM) comprising:
   an array of DRNVM cells having rows of data and columns of code word symbols;
   read-restore logic, coupled to the array of DRNVM cells, and configured to destructively read data from a row of the DRNVM cells and to restore the data to the row of the DRNVM cells; and
   error correction logic, coupled to the read-restore logic, and configured to correct an error in a column of the code word symbols based on the code word symbols in a same column of the DRNVM cells.

2. The DRNVM of claim 1, further comprising:
   power control logic, coupled to the array of DRNVM cells, and configured to remove power from the array of DRNVM cells in response to a power-off command after the read-restore logic has completed a read-restore cycle;
   status logic, coupled to the power control logic, and configured to store a first power-off signature during operation of the array of DRNVM cells and to store a second power-off signature in response to completion of the power-off command; and
   control logic, coupled to the error correction logic, and configured to detect when power is applied to the array of DRNVM cells and to cause the error correction logic to perform an error correction on each column of code word symbols in response to power being applied to the array of DRNVM cells when a power-off status is the first power-off signature.

3. The DRNVM of claim 1, further comprising encoding logic, coupled to the read-restore logic, and configured to create respective error correction code symbols for the columns of code word symbols.

4. The DRNVM of claim 3, wherein the encoding logic creates a Reed-Solomon code for each column of code word symbols.

5. A method of operating a destructive read non-volatile memory (DRNVM), the method comprising:
storing data in the DRNVM, the DRNVM including an array of DRNVM cells having rows of data and columns of code word symbols;
encoding the columns of code word symbols to produce respective error correction code symbols therefor; and
storing all of the error correction code symbols in a single row of the DRNVM cells.

6. The method of claim 5, further comprising booting the DRNVM after applying power to the DRNVM, in which booting the DRNVM includes checking a status signature and performing an error correction decode on each column of code word symbols when a first status signature indicates occurence of a DRNVM power fail event that was not a commanded power-down for the DRNVM.

7. The method of claim 6, wherein booting the DRNVM includes not performing the error correction decode on each column of code word symbols when a second status signature indicates the DRNVM power fail event was a commanded power-down for the DRNVM.

8. The method of claim 7, further comprising setting the status signature to the first status signature prior to booting the DRNVM.

9. The method of claim 7, further comprising:
performing read-restore cycles on addressed rows of data;
receiving a command to power-down the DRNVM;
setting the second status signature after completing a read-restore cycle; and
removing power from the DRNVM.

10. The method of claim 5, further comprising:
writing a data word to an addressed row of data;
encoding the columns of code word symbols to produce respective new error correction code symbols therefor in response to writing the data word; and
storing all of the new error correction code symbols in a parity buffer that is separate from the array of DRNVM cells.

11. The method of claim 5, wherein encoding each column of code word symbols uses a Reed-Solomon code.

12. A method of operating a memory system, the method comprising:
storing data in the memory system, the memory system including an array of memory cells having rows of data and columns of code word symbols;
encoding the columns of code word symbols to produce respective error correction code symbols therefor;
storing all of the error correction code symbols in a single row of the memory cells;
accessing data from the memory system by selecting a row of the memory cells and accessing the selected row of the memory cells; and
performing an error correction on a selected column of code word symbols by accessing a code word symbol for the selected column from each row of the memory cells.

13. The method of claim 12, further comprising performing the error correction on each column of code word symbols.

14. The method of claim 12, further comprising:
detecting an event that indicates the error correction should be performed; and
performing the error correction in response to the detected event.

15. The method of claim 14, wherein the detected event indicates that an unexpected power loss occurred to the array of memory cells.

* * * * *